United States Patent [19]

Homma

[11] Patent Number: 5,215,787
[45] Date of Patent: Jun. 1, 1993

[54] METHOD OF FORMING SILICON OXIDE FILM CONTAINING FLUORINE

[75] Inventor: Tetsuya Homma, Tokyo, Japan

[73] Assignee: NEC Corporation, Tokyo, Japan

[21] Appl. No.: 820,254

[22] Filed: Jan. 14, 1992

[30] Foreign Application Priority Data

Jan. 23, 1991 [JP] Japan .................................. 3-006312

[51] Int. Cl.$^5$ ............................................. C23C 16/40
[52] U.S. Cl. ............................. 427/248.1; 427/255.1; 427/314; 427/255; 427/255.7; 156/656
[58] Field of Search ................... 427/248.1, 255.1, 255, 427/314, 255.7; 156/656; 437/228

[56] References Cited

U.S. PATENT DOCUMENTS 4,300,989  11/1981  Chang ..................................... 427/38

OTHER PUBLICATIONS

Ikeda et al., "Oxide Film Formation Using O$_3$/Organic-Source APCVD", Denkikagaku, 56, No. 7 (Jul. 1988), pp. 527–532.
Ikeda et al., "Ozone/Organic-Source APCVD for Conformal Doped Oxide Films", Journal of Electronic Materials, vol. 19, No. 1, Jan. 1990, pp. 45–49.

*Primary Examiner*—Michael Lusigan
*Assistant Examiner*—Roy V. King
*Attorney, Agent, or Firm*—Burns, Doane, Swecker & Mathis

[57] ABSTRACT

It is an object of the present invention to provide an excellent silicon oxide film formed at a temperature of 200° C. or less, a method of forming the silicon oxide film, and a selective growing method. According to the present invention, by using a vapor containing alkoxyfluorosilane as a main component, a silicon oxide film containing fluorine is formed at a temperature of 200° C. or less in a reaction chamber having a predetermined temperature and a predetermined pressure. In addition, an organic film such as a photoresist film is used as a mask to selectively form the silicon oxide film. Although the silicon oxide film containing fluorine and formed on the basis of the present invention is formed at a very low temperature of 30° C., this silicon oxide film has a water content smaller than that of a silicon oxide film formed at a temperature of 250° C. in a conventional method. In addition, the film properties of the silicon oxide film according to the present invention are better than those of the silicon oxide film formed in the conventional method. Furthermore, a two-layered aluminum wiring structure can be easily formed by the selective growing method.

7 Claims, 3 Drawing Sheets

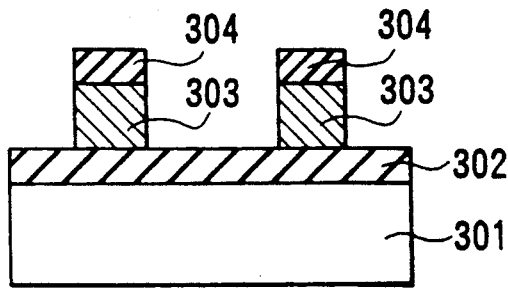
F I G. 4A
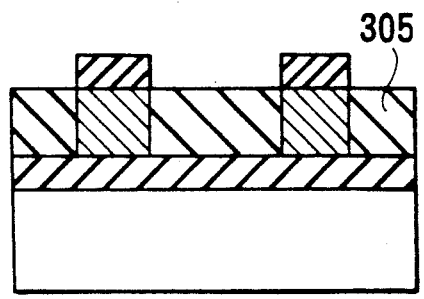
F I G. 4B
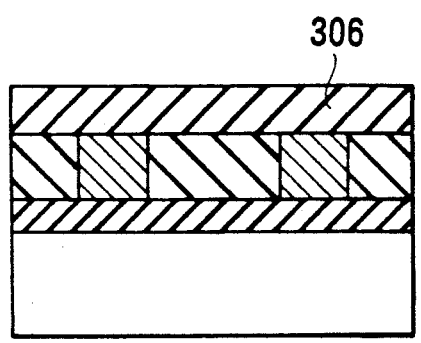
F I G. 4C
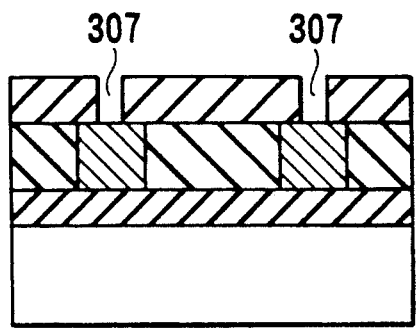
F I G. 4D
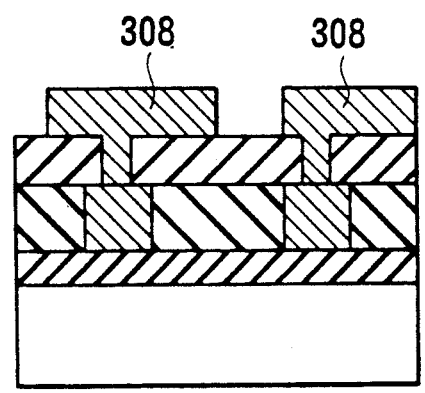
F I G. 4E

METHOD OF FORMING SILICON OXIDE FILM CONTAINING FLUORINE

BACKGROUND OF THE INVENTION

The present invention relates to a method of forming an insulating film and, more particularly, to a method of forming a silicon oxide film containing fluorine.

As a conventional method of forming a silicon oxide film of this type, a chemical vapor-phase deposition method is popularly used. For example, the following method is used. That is, tetraethylorthosilicate (chemical formula: $Si(OC_2H_5)_4$) serving as a source gas is evaporated by bubbling and then mixed with ozone in a reaction chamber so as to form a silicon oxide film at a substrate temperature of 300° C. to 400° C. and an atmospheric pressure. In addition, a method of doping phosphorus and boron by using trimethylphosphate (chemical formula: $PO(OCH_3)_3$) and trimethylborate (chemical formula: $B(OCH_3)_3$) as doping gases is used ("Ozone/Organic-Source APCVD for Conformal Doped Oxide", Journal of Electronic Materials, Vol. 19, No. 1, 1990).

This conventional method of forming a silicon oxide film has the following problems. That is, since a temperature for forming a film is high, i.e., 300° C. to 400° C., a silicon oxide film cannot be selectively formed by using an organic film such as a photoresist film as a mask. In addition, when the temperature is decreased, film properties are considerably degraded, and the film cannot be disadvantageously used in practical applications. Furthermore, since a silicon oxide film formed in the conventional method has a strong tensile stress of about $1 \times 10^9$ dyn/cm$^2$ as an internal stress, when a film having a thickness of 2 μm or more is formed, cracks easily occur in this film. For this reason, this film is not easily formed on a substrate such as an aluminum wiring layer having an uneven surface.

SUMMARY OF THE INVENTION

It is an object of the present invention to provide a silicon oxide film containing fluorine in which film properties are not degraded even when a temperature for forming the film is decreased.

It is another object of the present invention to provide a silicon oxide film containing fluorine which can be selectively formed by using an organic film such as a photoresist film as a mask.

It is still another object of the present invention to provide a silicon oxide film containing fluorine which can be formed on a substrate such as an aluminum wiring layer having an uneven surface.

It is still another object of the present invention to provide a silicon oxide film containing fluorine which can be practically used as an insulating film used in a semiconductor device.

In order to achieve the above objects of the present invention, there is provided a method of forming a silicon oxide film containing fluorine, wherein a silicon oxide film is formed using a vapor containing alkoxyfluorosilane (chemical formula: $F_n\text{-}Si(OR)_{4-n}$, R: an alkyl group, n: an integer of 1 to 3) as a main component in a reaction chamber having a predetermined temperature and a predetermined pressure at a substrate temperature of not more than 200° C.

BRIEF DESCRIPTION OF THE DRAWINGS

FIGS. 4A, 4B, 4C, 4D and 4E are sectional views showing the steps in manufacturing a semiconductor device according to the second embodiment of the present invention.

DETAILED DESCRIPTION OF THE PREFERRED EMBODIMENTS

The present invention will be described below with reference to the accompanying drawings. In the following embodiments, triethoxyfluorosilane (chemical formula: $F\text{-}Si(OC_2H_5)_3$) is used as alkoxyfluorosilane.

Figure 1:
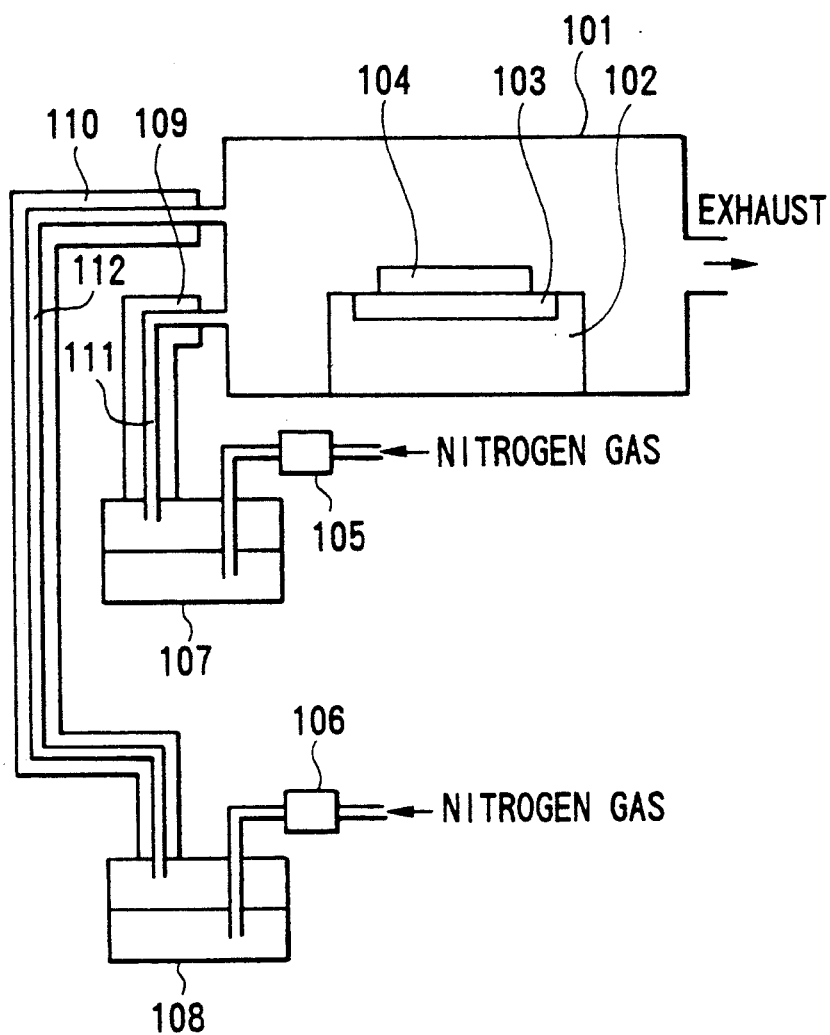
FIG. 1 is a schematic view showing an apparatus for forming a silicon oxide film according to the first embodiment of the present invention.

A film forming apparatus is schematically shown in FIG. 1. In FIG. 1, a susceptor 102 is arranged in a reaction chamber 101, the susceptor 102 has a heater 103, and a semiconductor substrate 104 is fixed on the susceptor 102. The susceptor 102 may be arranged on either an upper or lower side of the apparatus, and the semiconductor substrate surface may face either the upper or lower direction. Triethoxyfluorosilane present in a bubbler 107 kept at a predetermined temperature is bubbled by nitrogen gas having a predetermined flow rate controlled by a flow rate controller 105, and is supplied to the reaction chamber 101. Steam used for a hydrolysis reaction between triethoxyfluorosilane and containing distilled water is bubbled by nitrogen gas having a predetermined flow rate controlled by a flow rate controller 106 and is supplied from a bubbler 108 kept at a predetermined temperature to the reaction chamber 101. The reaction chamber 101 is always evacuated to be kept at a predetermined pressure. The temperatures of gas supply tubes 111 and 112 respectively extending from the bubblers 107 and 108 to the reaction chamber are kept to be constant by heaters 109 and 110.

A silicon oxide film was formed on a silicon substrate having a diameter of 6 inches in the above apparatus. The temperature of the bubbler 107 for triethoxyfluorosilane and the bubbler 108 for distilled water were kept to be 40° C. and 60° C., respectively, the flow rate of nitrogen gas used for bubbling was set to be 1 SLM, a substrate temperature was fixed to 30° C., and a pressure in the reaction chamber 101 was set to be about 700 Torr.

Figure 2:
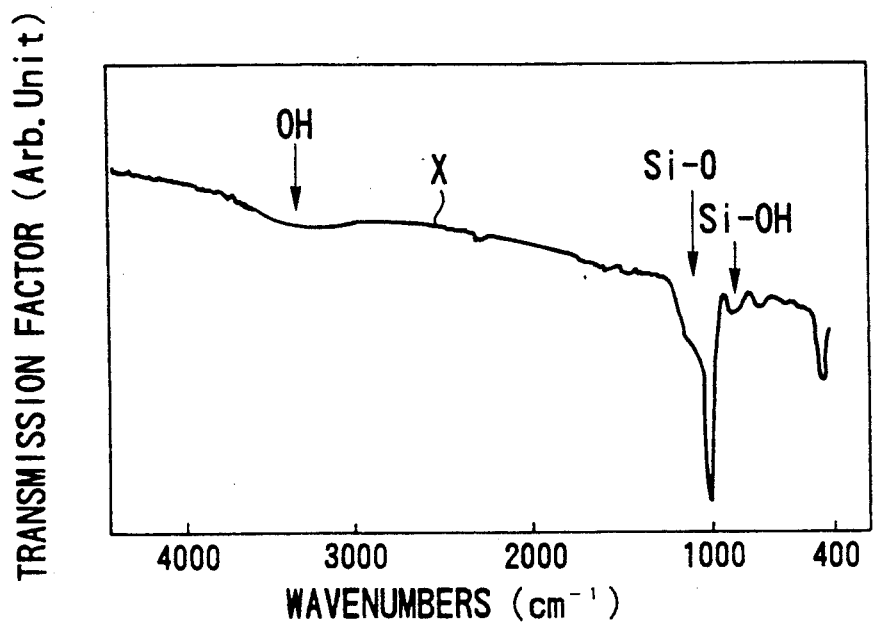
FIG. 2 is a graph showing fourier transform infrared absorption spectra of a silicon oxide film formed according to the present invention.
Figure 3:
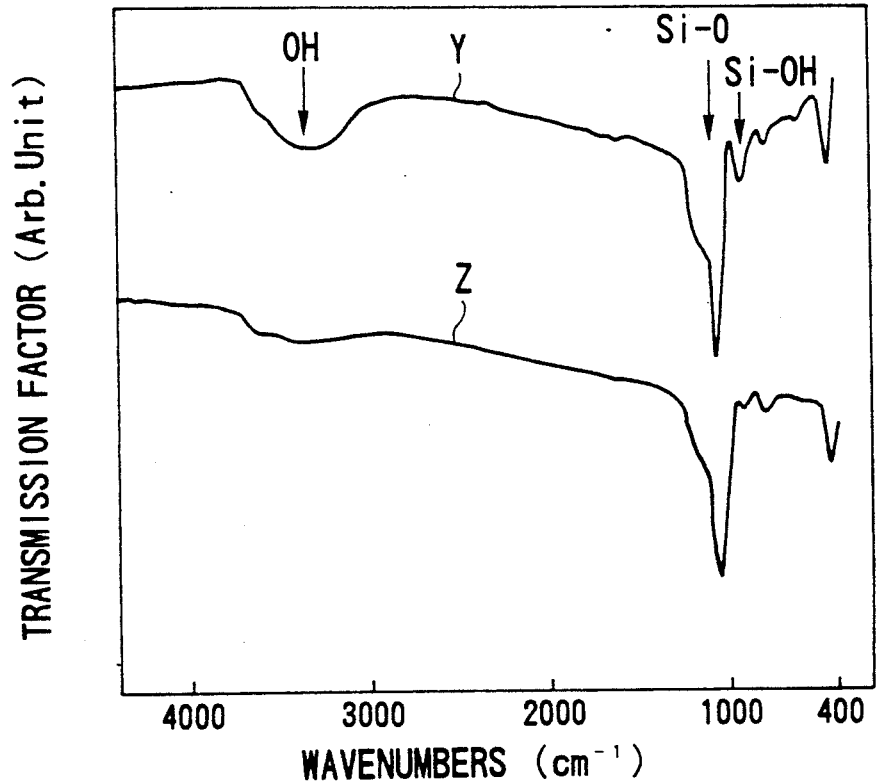
FIG. 3 is fourier transform infrared absorption spectra of a conventional silicon oxide film.

In FIGS. 2 and 3, fourier transform infrared absorption spectra of this embodiment and the prior art were compared with each other. According to this embodiment, when a film deposition was performed for 60 minutes to form a silicon oxide film containing flourine and having a thickness of about 0.5 μm, the fourier transform infrared absorption spectrum (FT-IR) indicated by X in FIG. 2 could be obtained. When silicon oxide films each having a thickness of about 0.5 μm were formed at temperatures of 250° C. and 350° C. in a method according to the prior art, fourier transform infrared absorption spectra (FT-IR) indicated by Y and Z in FIG. 3 could be obtained. In FIG. 2, absorption peaks corresponding to hydroxyl radicals, Si-0 bonds, and Si-OH bonds are observed at wave numbers of around 3,300 cm$^{-1}$, around 1,070 cm$^{-1}$, and around 930 cm$^{-1}$, respectively, and it is understood that a film having Si-0 as a main component is formed. As a result, although the film of this embodiment is formed at a very low temperature of 30° C., the absorption peak intensity corresponding to the hydroxyl radicals in FIG. 2 is smaller than that (indicated by Y in FIG. 3) corresponding to the hydroxyl radicals of the silicon oxide film formed at the temperature of 250° C. in the conventional method. This means that the silicon oxide film according to the present invention has a water content less than that of the silicon oxide film formed at a relatively low temperature of 250° C. in the conventional method. In addition, when the silicon oxide film according to the present invention is compared with a silicon oxide film formed at a temperature of 350° C. (indicated by Z in FIG. 3) in the conventional method, the absorption peaks corresponding to the hydroxyl radicals of both the silicon oxide films are equal to each other. That is, the water content of the silicon oxide film formed at a very low temperature of 30° C. on the basis of the present invention is equal to the water content of the silicon oxide film formed at the temperature of 350° C. in the conventional method.

The refractive index of the silicon oxide film formed in this embodiment was 1.42 which was lower than the refractive index of 1.45 of a conventional silicon oxide film. In addition, when a fluorine content in the silicon oxide film of this embodiment was measured by an X-ray photoemission spectroscopy, a fluorine atom concentration was about 7 atom %. According to this embodiment, a film stress of $2 \times 10^8$ dyn/cm$^2$ which was smaller than the film stress ($1 \times 10^9$ dyn/cm$^2$) of the silicon oxide film formed by the conventional method can be obtained.

An aluminum electrode having an area of about 4 mm$^2$ was formed on the silicon oxide film formed in this embodiment, and its electric characteristics were examined. As a result, a leakage current density of the electrode during an application of 5 V was about $5 \times 10^{-11}$ A/cm$^2$, and the value was smaller than the leakage current density of about $2 \times 10^{-10}$ A/cm$^2$ of a silicon oxide film having the same thickness as that of the above silicon oxide film and formed at the temperature of 350° C. in the conventional method. In addition, a dielectric breakdown strength of 5 MV/cm which was greater than a dielectric breakdown strength of 4 MV/cm of the silicon oxide film formed in the conventional method could be obtained. A relative dielectric constant calculated from capacitance-voltage characteristics at the measurement frequency of 1 MHz was 3.7, and the value was smaller than the relative dielectric constant of 4.0 of the silicon oxide film formed in the conventional method.

Film forming conditions are not limited to those in this embodiment. According to this embodiment, a substrate temperature may be set to be 200° C. or less, and the temperature is set such that projections called hillocks are not formed when a silicon oxide film is formed on an aluminum wiring layer. In contrast to this, projections called hillocks were formed at a temperature above 250° C. In addition, a pressure in the reaction chamber, a gas flow rate, and the like can be changed.

The second embodiment of the present invention will be described below with reference to FIGS. 4A to 4E. In this embodiment, the same film forming conditions as described in the first embodiment are used.

FIGS. 4A to 4E are cross-sectional views showing the steps in manufacturing a semiconductor device when a selective growing method of a silicon oxide film according to the second embodiment of the present invention is applied to an insulating interlayer of a two-layered aluminum wiring structure. In FIG. 4A, a PSG (Phosphosilicate Glass) film 302 having a thickness of about 0.5 μm and a first aluminum wiring layer 303 having a thickness of about 1 μm are sequentially formed on a semiconductor substrate 301. At this time, a photoresist film 304 serving as an organic film pattern and formed when the aluminum wiring layer is patterned is left. Note that a Teflon film or a polyimide film may be used as the organic film pattern. As shown in FIG. 4B, according to the present invention, a silicon oxide film 305 containing fluorine and having a thickness of about 1 μm is selectively formed on only a PSG film portion having no photoresist film 304. After the photoresist film 304 is ashed in an oxygen plasma, according to the present invention, as shown in FIG. 4C, a silicon oxide film 306 containing fluorine and having a thickness of about 0.7 μis formed on the entire surface of the resultant structure. As shown in FIG. 4D, openings 307 are formed in the silicon oxide film 306 in correspondence with the first aluminum wiring layer by the well-known photoetching method. Finally, as shown in FIG. 4E, a second aluminum wiring layer 308 is formed, such that a two-layer aluminum wiring structure having a perfectly flat dielectric film surface can be obtained.

In the two-layer aluminum wiring structure having the first and second aluminum wiring layers 303 and 308 and formed in the above steps, the upper second aluminum wiring layer 308 was free from disconnections and short circuits, and a high yield could be obtained. In addition, any crack in the interlayer dielectric film was not observed.

Film forming conditions are not limited to those in this embodiment. A substrate temperature may be set to be lower than a maximum temperature of 150° C. at which the photoresist film is not deteriorated.

In this embodiment, although aluminum is used as a wiring material, the wiring layer may be made of a material selected from the group consisting of polysilicon, aluminum alloys, gold, tungsten, molybdenum, and titanium alloys.

An insulating film formed by another method can be used in place of the silicon oxide film containing fluorine which is formed after the photoresist film is ashed. In addition, a photoresist film is not left when an aluminum wiring layer is patterned, and a silicon oxide film containing fluorine can be formed on the entire surface of the resultant structure and used as an insulating interlayer.

In this embodiment, although the present invention is applied to a multi-layered wiring interlayer, the present invention can be applied to other applications as a method of selectively forming a silicon oxide film.

As described above, according to the present invention, since a vapor containing alkoxyfluorosilane as a main component is used, a silicon oxide film can be advantageously formed at a low temperature of 200° C. or less, more particularly, even at room temperature. Film properties of a silicon oxide film formed on the basis of the present invention are better than those of the silicon oxide film formed in a conventional method, and the silicon oxide film according to the present invention can be practically used as an insulating film used in a semiconductor device.

In addition, according to the present invention, the following advantages can be obtained. That is, since a silicon oxide film can be formed at a temperature of 150° C. or less, a silicon oxide film can be selectively formed using an organic film such as a photoresist film as a mask, and an uneven surface formed in the manufacturing steps of a semiconductor device can be easily flattened.

The present invention, therefore, provides many effects to a method of manufacturing a semiconductor device. Furthermore, the present invention can be sufficiently applied to other electric devices.

What is claimed is:

1. A method of forming a silicon oxide film containing fluorine on a substrate, wherein said silicon oxide film is formed using a vapor containing an alkoxyfluorosilane represented by the general formula $F_n\text{-}Si(OR)_{4-n}$, wherein R is an alkyl group and n is an integer of 1 to 3, as a main component in a reaction chamber at a substrate temperature of not more than 200° C.

2. The method according to claim 1, wherein triethoxyfluorosilane is used as the alkoxyfluorosilane.

3. A method of forming a silicon oxide film containing fluorine, wherein said silicon oxide film is selectively formed on a substrate surface having an organic film pattern, except at portions for said organic film pattern, using a vapor containing alkoxyfluorosilane as a main component in a reaction chamber at a substrate temperature of not more than 150° C.

4. The method according to claim 3, wherein said organic film pattern is formed by any one of a photoresist film, a Teflon film, and a polyimide film.

5. The method according to claim 3, wherein said organic film pattern is formed on a wiring pattern formed on a semiconductor substrate, and another silicon oxide film is formed as an insulating interlayer on said wiring pattern from which said organic film pattern is removed and on said silicon oxide film.

6. The method according to claim 5, wherein said another silicon oxide film contains fluorine.

7. A method according to claim 3, wherein said organic film pattern is formed on a wiring pattern formed on a semiconductor substrate, and an insulating film is formed as an insulating interlayer on said wiring pattern from which said organic film pattern is removed and on said silicon oxide film.

* * * * *